United States Patent [19]
Chalupka et al.

[11] Patent Number: 5,317,161
[45] Date of Patent: May 31, 1994

[54] ION SOURCE

[75] Inventors: Alfred Chalupka; Gertraud Lammer, both of Vienna; Gerhard Stengl, Wernberg; Peter Wolf; Johannes Fegerl, both of Vienna, all of Austria

[73] Assignee: IMS Ionen Mikrofabrikations Systeme Gesellschaft m.b.H., Vienna, Austria

[21] Appl. No.: 888,661

[22] Filed: May 21, 1992

[30] Foreign Application Priority Data

May 24, 1991 [AT] Austria .................. 1067/91

[51] Int. Cl.$^5$ ........................... H01J 37/08
[52] U.S. Cl. .................. 250/423 R; 315/111.81
[58] Field of Search ........... 250/396 R, 398, 423 R; 315/111.81

[56] References Cited

U.S. PATENT DOCUMENTS

| | | | |
|---|---|---|---|
| 3,141,993 | 7/1964 | Hahn | 250/396 R |
| 3,569,757 | 3/1971 | Brewer et al. | 250/396 R |
| 3,852,637 | 12/1974 | Yamazaki et al. | 315/16 |
| 4,439,685 | 3/1984 | Plies | 250/396 R |
| 4,710,632 | 12/1987 | Ishitani et al. | 250/396 R |
| 4,870,284 | 9/1989 | Hashimoto et al. | 250/423 R |
| 4,963,735 | 10/1990 | Okamoto et al. | 250/288 |
| 5,049,739 | 9/1991 | Okamoto | 250/281 |

FOREIGN PATENT DOCUMENTS

| | | |
|---|---|---|
| 386297 | 7/1988 | Austria . |
| 0216750 | 4/1987 | European Pat. Off. . |
| 9010303 | 10/1990 | World Int. Prop. O. . |

OTHER PUBLICATIONS

Journal of Vacuum Science & Technology/Part B; vol. 6, No. 3; May 1988 Munro: Finite Difference Programs for Computing Tolerances For . . . .

Journal of Vacuum Science & Technology/Part A; vol. 8, No. 5; Sep. '90 SZEP et al: Improved Automated Lens Design Design for LMI Sources.

Journal of Vacuum Science & Technology/Part B; vol. 3, No. 1; Jan. '85 Kurihara: A Focused Ion Beam System for Submicron Lithography.

Primary Examiner—Bruce C. Anderson
Attorney, Agent, or Firm—Herbert Dubno

[57] ABSTRACT

In addition to the three electrodes of a unipotential lens following a plasma chamber, an ion source for ion beam lithography or ion beam semiconductor or the like has a fourth electrode which is at the same potential as the second electrode and at a potential lower than the potential of the first and third electrodes The result is improved resolution.

16 Claims, 7 Drawing Sheets

ION SOURCE

FIELD OF THE INVENTION

The present invention relates to relates to a duoplasmatron type of ion source for use in ion-optical imaging systems, for example, ion projection lithography 1:1, masked ion beam lithography, focused ion beam repair systems and other systems in which an ion beam is projected with or without the use of a mask and with or without the use of a scanning system playing the beam over a substrate, to structure that substrate.

More particularly, the invention relates to an ion source for these purposes which comprises a plasma space or chamber in which ions are generated by any convenient plasma generating means, and an electrode assembly connected with the plasma generator and having three electrodes which are mutually electrically insulated from one another and each of which is formed with a central aperture or window traversed by the ions extracted from the plasma chamber and transmitted to the ion-optical imaging system downstream therefrom.

BACKGROUND OF THE INVENTION

In ion projection lithographic systems, the structure of a mask can be imaged or reproduced in a substrate (e.g. a wafer of semiconductive material), by means of an ion beam. The imaging is effected by ion optics disposed downstream of the mask and comprised of a combination of ion optical lenses. In the case of electrostatic lenses, the imaging characteristics, like, focal length and principal planes, are defined by the so-called potential voltage ratio.

The voltage ratio R is understood, for two-electrode lenses (so-called immersion lenses) with the potentials $V_o$, and $V1$ for the two lenses, as $R = E_o/E_i$ where $E_i$ is the input energy of the ions and $E_o$ is the output energy of the ions. For the case in which $E_i = -V_o \cdot e$ (where e is the elemental charge unit or electron charge), $R = V1/V_o$.

For a three electrode lens operated as a so-called EINZEL lens, the three electrode potentials in succession are $V_o$, $V_1$, $V_o$, for which $R = (E_i - (V1 - V_o) \cdot e/E_i)$, where again e is the elemental charge. For the case in which $E_i = -V_o \cdot e$, $R = V1/V_o$.

By applying the corresponding potentials to the electrodes, the voltage ratio for the desired imaging characteristic can be obtained for predetermined values of the ion energy $E_i$ or $E_o$. Every deviation of the ion energy from the basic value $E_i$ results in a variation, as noted above, in the potential ratio R and therefore a different image scale for the same point of the mask. That means that the resolution decreases. The greater the energy blurring or spread of the energy spectrum of the ions deriving from the ion source, the poorer is the resolution of the structure formed upon the wafer. The magnetic lenses operate analogously and the settings thereof also are applicable only for a predetermined energy value of the ions.

Another parameter which determines the resolution is the size of the so-called virtual ion source. The location of the virtual ion source is found by projecting the ion trajectories leaving the extraction system, i.e. from the field free space, rearwardly towards their origin and locating the smallest diameter of that bundle. The size of the virtual source is given by that diameter. The smaller the virtual source, the greater is the resolution.

For ion projection lithographic systems, ion sources are required at which the diameter of the so-called virtual ion source is held as small as possible, preferably smaller than or equal to 10 microns. For lithographic systems, duoplasmatron ion sources have been found to be particularly effective because with these sources there is a practically laminar extraction of the ions and, at a diameter of the outlet of the plasma chamber and of the source anode closing this outlet of 200 microns, the virtual ion source can attain a diameter of about 10 microns (see Austrian Patent 386 297).

For the reasons stated, a further critical point in the ion projection lithographic system is the distribution of the energy of the ions over the mask against which the ions impinge. Since the potential ratio can only be set for a single input energy of the ions at the imaging lenses, ions whose input energy deviates from the predetermined energy $E_o$, result in an unsharp reproduction of the mask structure upon the wafer and thus a reduction in the resolution.

Previously used duoplasmatron ion sources (R. Keller, "A High-Brightness Duoplasmatron Ion Source", in "Ion Implantation: Equipment and Techniques", Springer Series, ed. H. Ryssel, H. Glawischnig) have an anode-bounded plasma chamber in which gas particles are ionized by electrodes and/or ions are produced with the aid of a thermonic generator and then passed via two further electrodes of which one (the so-called suppressor electrode) is at a lower potential than the anode and a second electrode (the so-called extraction electrode) is at a higher potential than the suppressor electrode but which is still significantly less than that of the anode. The ions are thus accelerated to their final energy by the potential difference between anode and extraction electrode and the ions thus are passed from the plasma chamber with an energy which is the sum of the starting energy from the plasma chamber and the acceleration energy applied in the electrode assembly. The suppressor electrode serves to suppress the secondary electrons which arise at the extraction electrode and pass counter to the ion current.

Because of the statistical energy distribution within the plasma corresponding to the plasma temperature, the heretofore used duoplasmatron ion sources are characterized by a so-called intrinsic energy unsharpness of about ±5 eV with respect to the mean value given by the extraction potential.

An additional contribution to energy distribution of the ions impinging upon the mask results, in prior duoplasmatron sources, from ions which are first formed downstream of the anode by impact ionization of neutral gas particles. Such impingement ionization occurs primarily in the region between the anode and the suppressor anode because of the comparatively high ion current density predominating in this region. Since these ions travel only over a part of the acceleration stretch, their energy is significantly less than that of the ions emerging from the plasma chamber. Since this effect may produce a relatively high number of ions with relatively low energy as compared with the predetermined energy E, the contribution of these ions to the energy distribution of the ions impinging at the mask may be significantly higher than that of the intrinsic energy spread.

OBJECTS OF THE INVENTION

It is, therefore, the principal object of the present invention to provide an ion source, especially for use in ion optical imaging and structuring systems of the type described, which has a significantly reduced energy spread by comparison with conventional duoplasmatron sources and nevertheless has a diameter of the virtual source corresponding to the small diameter of such duoplasmatron sources or smaller.

Another object of the invention is to provide an improved ion source whereby drawbacks of earlier ion sources can be avoided.

SUMMARY OF THE INVENTION

These objects and others which will become apparent hereinafter are attained, in accordance with the invention by providing a three electrode assembly at the outlet side with a fourth electrode also having a centrally disposed window traversed by the ions and so connecting the electrodes to respective potential sources that the first and third electrodes have approximately the same potential which by comparison to that of the second and last or fourth electrode is higher so that the ions from the plasma chamber are accelerated by the potential difference between the first and last electrodes to their terminal energy.

More particularly, the ion generator of the invention can comprise:
- a plasma chamber having an outlet from which ions generated in the plasma chamber emerge; and
- an electrode assembly aligned with the outlet and traversed by ions supplied to the ion-optic imaging system, the electrode assembly comprising:
- first, second, third and fourth axially spaced electrodes arrayed in succession along a path of the ions through the assembly, having axially aligned windows traversed by the ions and centered on a common axis,
- means for applying approximately the same potentials to the second and fourth electrodes, and
- means for applying to the first and third electrodes substantially the same potentials at a level higher than the potentials at the second and fourth electrodes so that the ions traversing the assembly are accelerated to a final energy by a potential difference between the first and fourth electrodes.

The use of a fourth source electrode and the described potential distribution on the four electrodes means that the first three electrodes form a kind of EINZEL lens, namely, a retarding EINZEL lens which initially brakes the ions coming from the anode.

Because of the potential distribution across the four electrodes, the majority of the ions which have less than the extraction energy and thus the ions which are generated by particle collisions between the first two electrodes following the plasma chamber, do not emerge from the source. The fourth electrode effectively forms a diaphragm also for ions which contribute to the "intrinsic" energy unsharpness. The effect of the four electrodes for such that a fraction of the ions emerges from the source with an energy $E_o$, $$E_o = e.U_o = > = U_o[eV] \text{ for singly charged ions)}$$

emerges from the source. The electrodes of the EINZEL lens prevent low energy ions formed by impact ionization downstream of the anode from leaving the source while the fourth electrode beyond the EINZEL lens also prevents a fraction of the ions leaving the plasma with an energy which is higher than the present entry energy ($E_o$) from entering the imaging system. The invention, therefore, reduces energy spread by comparison with conventional duoplasmatron sources since ions from the plasma chamber are braked to their starting or thermal energy, whereas ions which are formed by collision outside the plasma chamber and therefore have a lower energy than desired are reflected; those ions which pass the first three electrodes are accelerated by the potential difference between the first and last electrodes of the four electrode assembly.

To suppress a current of secondary electrons moving against the ion beam travel direction, between the third and fourth electrodes as defined, a further suppressor electrode can be introduced which can be at a potential about 500 V below that of the last or fourth electrode.

It has been found to be advantageous to provide the electrodes at such potential and spacing that in the region of the axis the electrical field strength between neighboring electrodes is greater than 5 megavolts per meter. Due to this spacing and the resulting high field strength, the ions, which in the plasma are statistically distributed with respect to the energy and direction, are accelerated to almost identical energy and homogeneous directional distribution immediately after leaving the plasma chamber. Therefore, the ions are focused almost to a point in the region at the end of the anode. The field strength between the second and third electrodes provides the desired EINZEL lens effect and the field strength between the third and last (fourth) electrode has a similar significance to that between the first and second electrodes, namely, the ions with different techniques and energies are so focused that they seem to arise from a single source, the virtual source.

The practical equality of the potentials on the first and third electrodes downstream from the plasma chamber can be selected so that the third electrode is at a potential which is higher than the potential of the first electrode by such an amount that the potential at the center of the window of the third electrode is equal to the potential of the first electrode, or is less (up to 10% less) than the potential of the first electrode.

If the potential in the middle of the window of the third electrode is exactly equal to the potential applied to the first electrode then all ions which are slower than those deriving from the plasma chamber are rejected backwardly by the third electrode.

The potential of the third electrode must be somewhat higher than the potential of the first electrode in this case since the potential decreases toward the axis. To provide the requisite potential at the axis, the potential applied to the third electrode, depending upon the electrode configuration, must be about 10% higher than the potential applied to the first electrode. The total ion current is relatively low since a relatively large part of the ions from the plasma chamber are rejected rearwardly or are so deflected that the ions impact against the fourth electrode. When, as noted, the potential at the center of the window of the third electrode is slightly smaller than the potential on the first electrode a somewhat higher current will reach the fourth electrode. It suffices for this purpose that the first and third electrode can be exactly at the same potential as long as the diameter of the window of the third potential is not too great.

It is advantageous to have the window of the third electrode equal or greater than the window in the fourth electrode (in diameter or cross section) and to provide the smallest window as that of the anode or first electrode which can bound the plasma space. The third electrode has, as a result of its potential, a braking effect. This braking effect is greater as its window is small since then its potential in the region of the axis is increased. When the braking effect is too great, the ions are reflected or are so deflected that they hit the electrodes. The window of the third electrode should not be smaller than that of the fourth electrode.

The cross section of the first window limits the number of ions emerging from the chamber. The optimum cross section insures that all ions passing through this window also can traverse the window of the fourth electrode. All others can impinge upon electrodes contribute to the erosion of the latter.

The angle with which the ions emerge from the fourth electrode should also not exceed a predetermined value since those ions which emerge with an excessive angle are trapped in the diaphragm or diaphragms of the ion system downstream of the ion source. The requirements for a sufficient ion current are fulfilled when the window in the first electrode has the smallest cross section and in this case the third electrode can have the largest cross section of the windows of the four electrodes.

It has been found to be advantageous on fabrication grounds to form the four electrodes as plane parallel plates and in this case the windows of the three electrodes following the electrodes closing the plasma space can be of equal size.

According to a further feature of the invention, the first and third electrodes are at exactly the same potential and the second and fourth are at exactly the same potential. This embodiment represents a simplified construction since only a single voltage supply system is required.

Circuitry is simplified also when he first electrode is at ground potential and the fourth electrode at a negative potential or conversely the first electrode is at a positive potential and the fourth at ground potential.

BRIEF DESCRIPTION OF THE DRAWING

The above and other objects, features and advantages of my invention will become more readily apparent from the following description, reference being made to the accompanying highly diagrammatic drawing in which.

SPECIFIC DESCRIPTION

Figure 1:
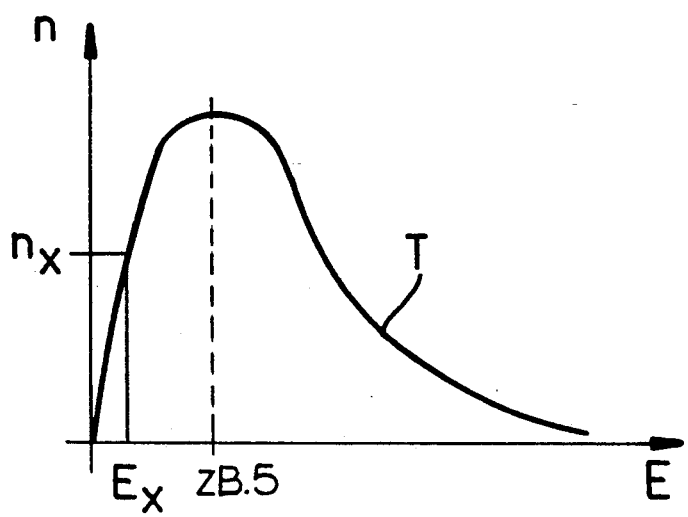
FIG. 1 is a graph illustrating the ion energy distribution at a given plasma temperature T, the fraction of ions having the particular energy being plotted along the ordinate versus the energy in electron volts plotted along the abscissa.
Figure 2:
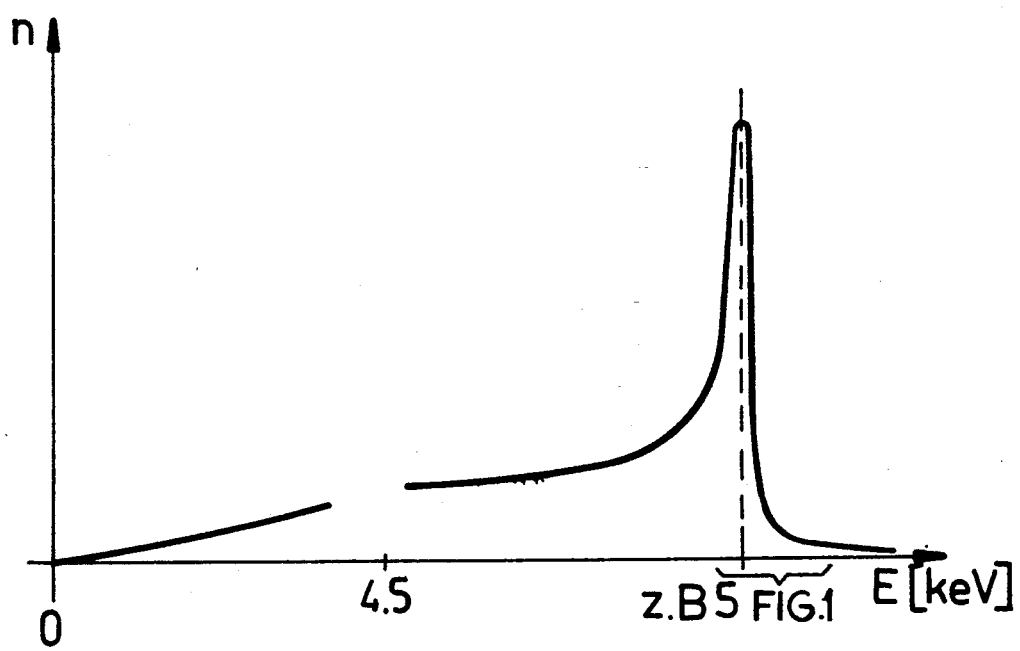
FIG 2. is a graph showing the energy distribution downstream of the extraction electrode in a conventional ion source, also plotting the ion fraction along the ordinate against energy along the abscissa.

FIG. 1 shows the energy distribution for a plasma temperature T whereby a given number or fraction $n_x$ of the ions have a predetermined energy $E_x$. In known duoplasmatron ion sources, upon extraction of the ions by the electrode arrangement connected to the plasma space or chamber, a significant fraction of the ions will have a lower energy than the extraction energy and originate rom particles which are ionized by impingement in the region between anode plates and extraction electrodes. This is illustrated in FIG. 2.

Figure 3:
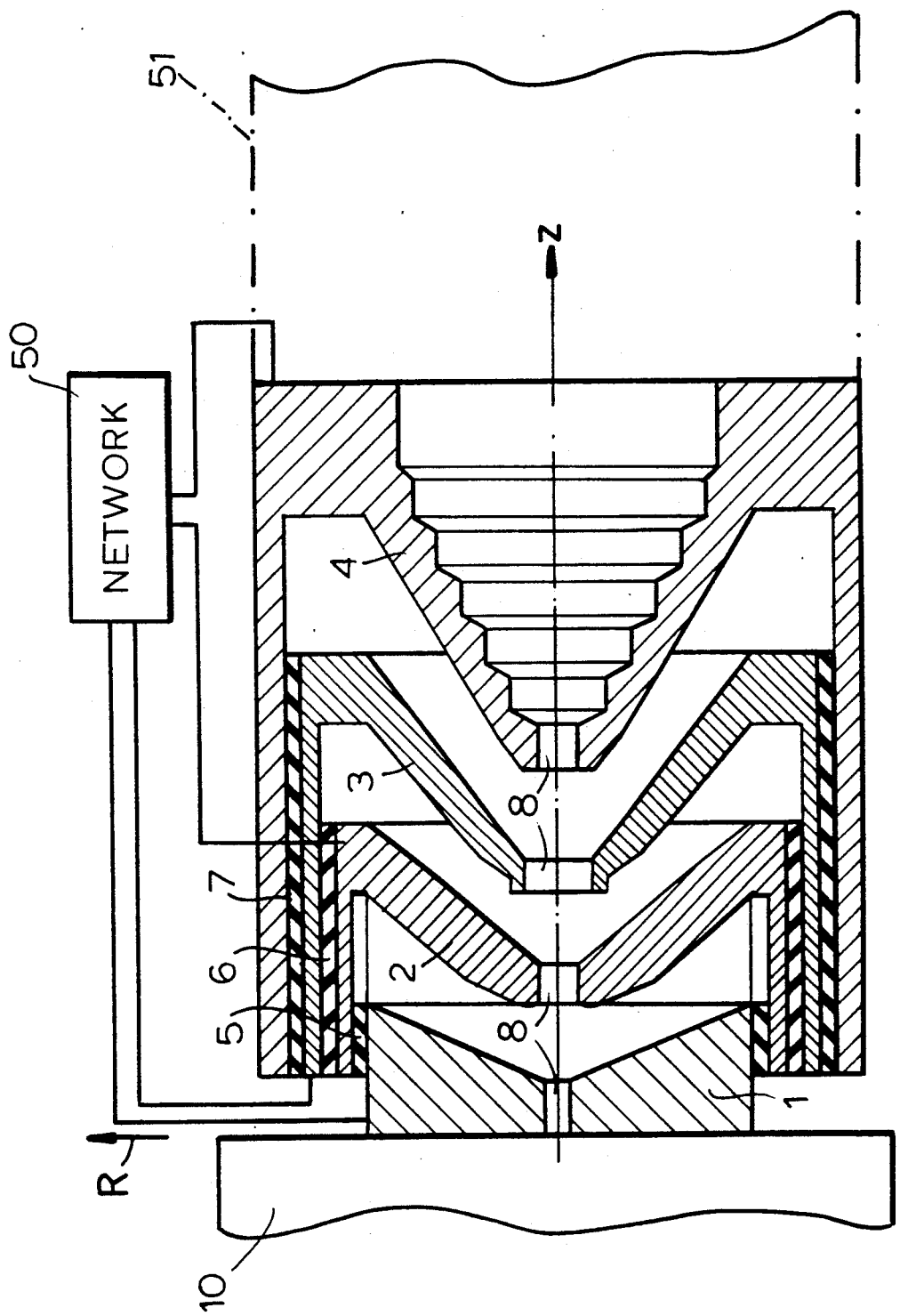
FIG. 3 is an axial cross section view through an electrode arrangement with four electrodes forming an ion source according to the invention.

FIG. 3 shows an ion source which comprises an anode 1 delimiting the plasma 10 at its outlet side. Following the anode 1 are three further electrodes, 2, 3 and 4, each of which has a central window 8 aligned with the window 8 of the anode 1.

In convention ion sources, in which the fourth electrode 4 is not present, the two electrodes 2 and 3 which are provided downstream of the anode 1 form a suppressor 2 at e.g. potential 0V and an extractor 3 which has a potential (for example 1.5 kV) which is small by comparison to the anode potential (for example 5.5 kV). Because of the potential distributor on the electrodes 1, 2, 3 of the ion source of the invention of $+U_o$ (electrode 1) O (electrode 2) and $+U_o$ (electrode 3), these form a retarded unipotential lens which is followed by a further electrode 4. This electrode 4 is at 0 V. Because of the electrode arrangement of FIG. 3 in which z represents distance along the common axis of the frustoconically shaped electrodes and R represents radial distance rom the axis thereof, and the selected potential distribution of $+U_o$, O V, $+U_o$ and O V, the greater part of the ions which have an energy lower than the extraction energy, i.e. those ions which are produced in the region between the electrodes 1 and 2 by impact ionization, are reflected.

The electrode 4 also acts as diaphragm for ions which contribute intrinsic energy spread, i.e. ions leaving the plasma with energies differing from the means energy.

Thus, the EINZEL lens formed by the electrodes 1,2,3 restricts the emission of ions of lower than the predetermined energy $E_o$, while the electrode 4 prevents the admission to the imaging system of an excessive umber of ions having a higher energy than the predetermined energy $E_o$.

The electrodes are separated from one another by rings 5, 6, 7 of insulating material. The dimension of the electrodes 1, 2, 3, 4 and the voltages which are applied to the individual electrode can be seen from FIG. 4 and are given in terms of mm in the axial and radial directions Z and R.

Figure 4:
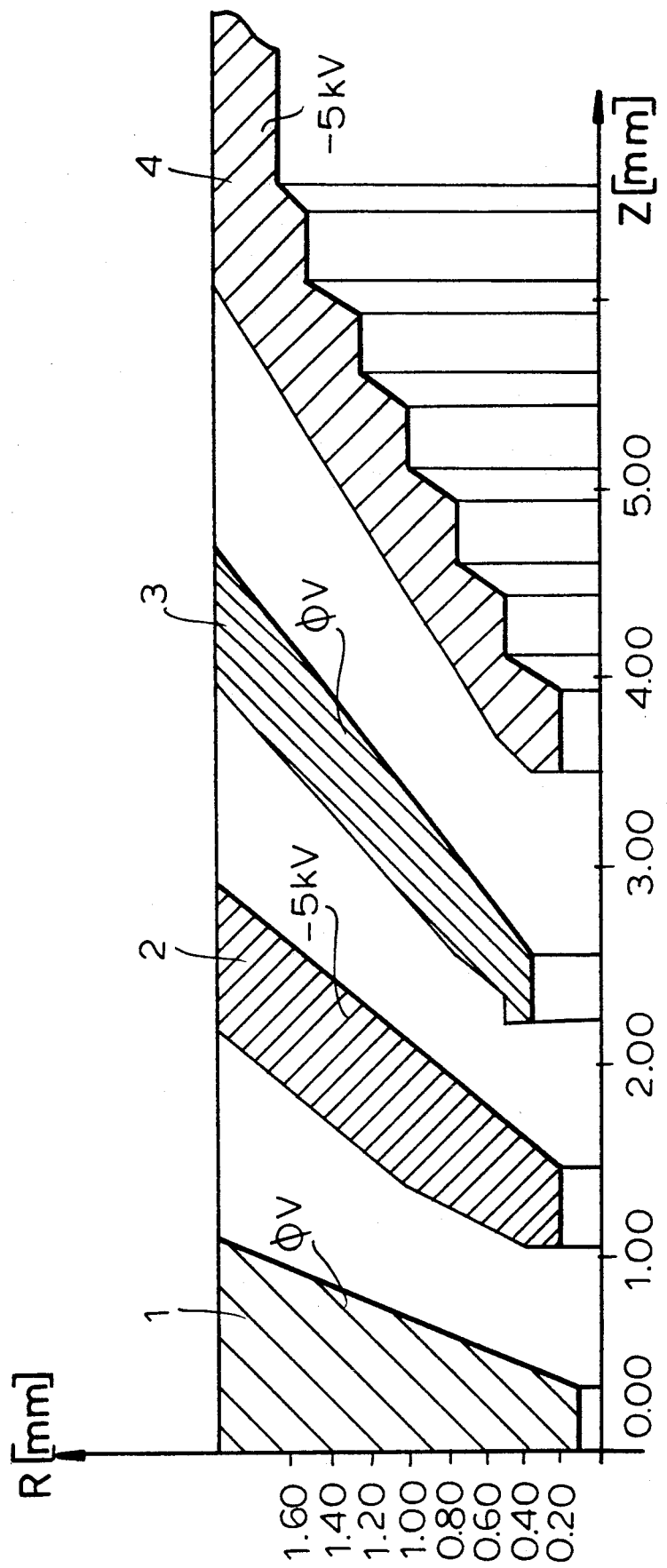
FIG. 4 is a diagram showing this ion source in terms of only half the rotationally symmetrical electrodes, whose potentials are given, the radial distance outwardly along the electrode being plotted along the ordinate while Z, also in mm along the ordinate, represents axial distance therealong.
Figure 5:
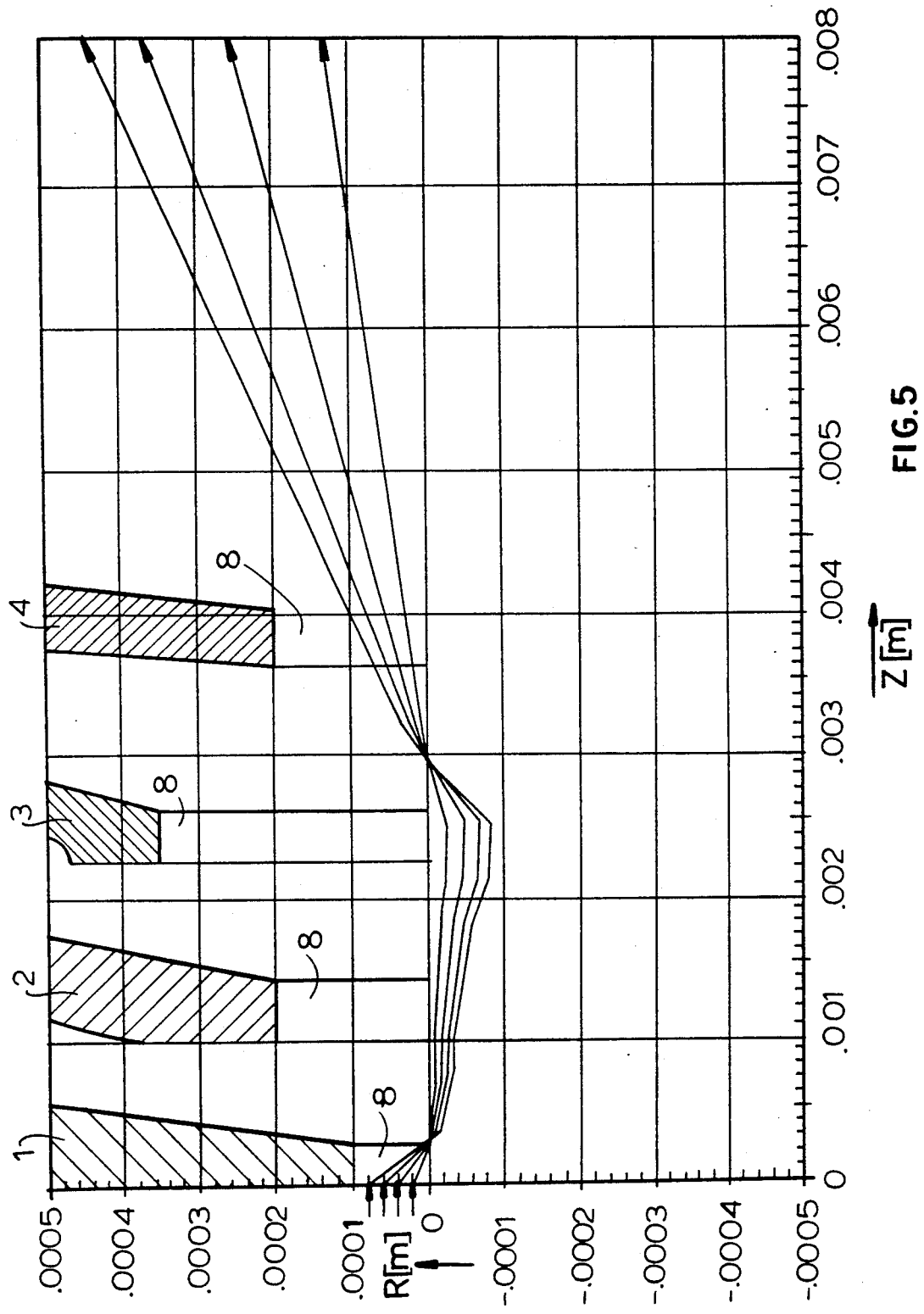
FIG. 5 is a graphic illustration of the electrode arrangement of FIGS. 3 or 4, showing the paths of one eV ions and wherein to establish the scale ratio, the drawing is treated as a raster or grid.

FIG. 5 shows the electrodes 1, 2, 3, 4 and the arrangement of FIGS. 3 or 4 and the computer calculated ion paths for 4 ions which enter the positive half of window 8 of the first electrode, anode 1, with an initial energy of one $le_v$ parallel to the z axis at z=o.

Figure 6:
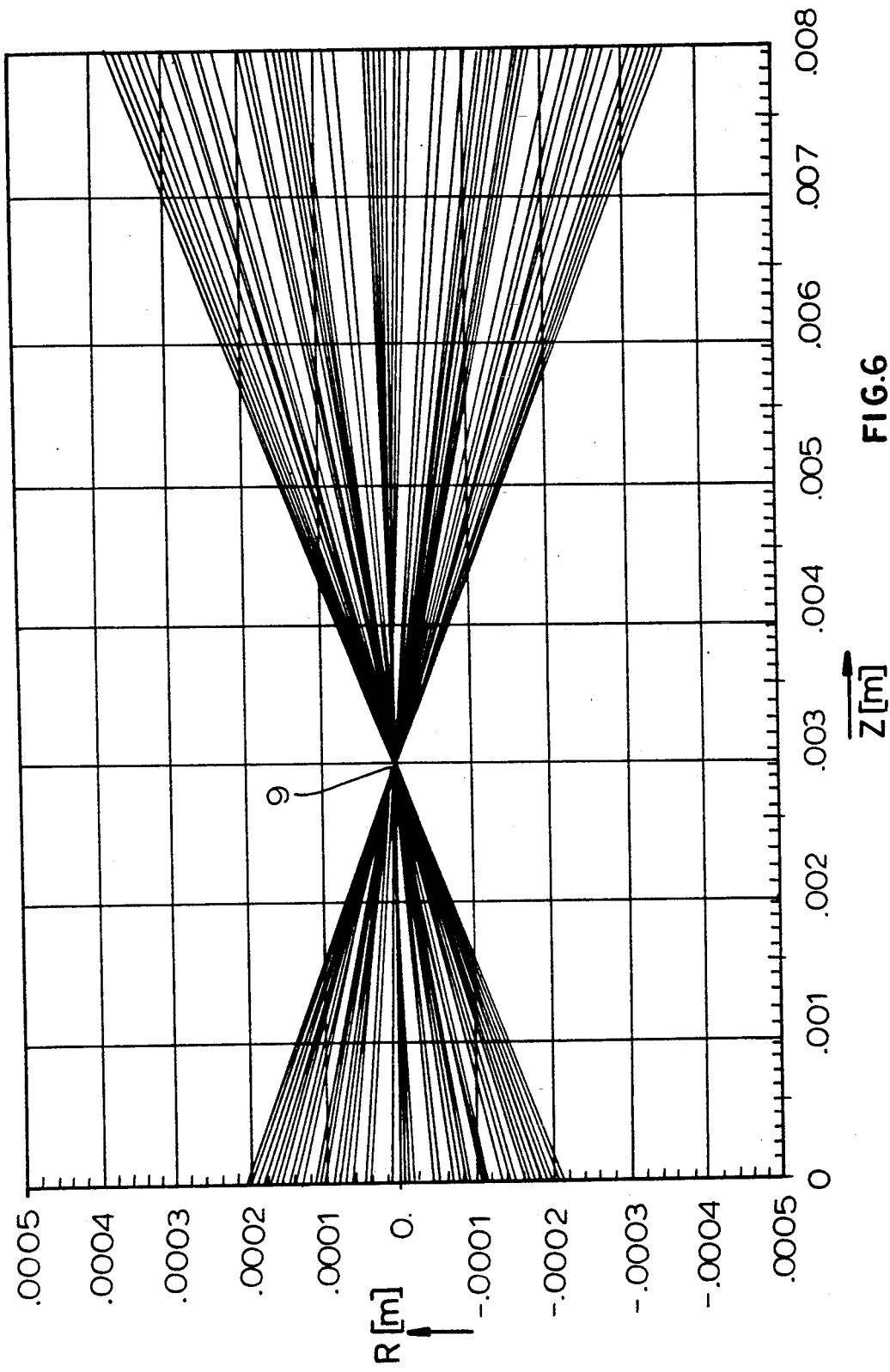
FIG. 6 is an illustration, also on a grid of the virtual ion source of an arrangement according to FIGS. 3 or 4 in which the paths of the one eV ions are extended rearwardly.

In FIG. 6, the trajectories of 49 ions through the device of FIG. 3 or FIG. 4 have been computed to extend beyond the field-free space downstream of electrode 4. The straight line paths have been extended rearwardly and it can be seen that the define a virtual source 9 whose position is plotted on the grid of FIG. 6. This system is generated by the following starting conditions:

The ions at the location z=o arrive with a predetermined starting energy from the plasma space 10 of the ion source at the window 8 of the electrode 1 (anode), a planar plasma boundary being assumed.

The distribution of the starting points over the radius of this window 8 is random as is the distribution of the starting angle although these are limited to ±10° with reference to the z axis.

The coulombic exchange between the ions on the individual ion paths is ignored for simplicity of calculation.

From the following Table 1, the size of the virtual source and the energy selection of an electrode arrangement according to FIG. 4 (6) will be apparent:

TABLE 1

| Plasma Boundary | Starting Energy | Number of starting ions ($n_o$) | Number of transmitted ions (n) Downstream | $n/n_o$ | Diameter of the virtual source |
|---|---|---|---|---|---|
| 0 mm | 1 eV | 49 | 38 | 0.78 | ~7 μm |
| 0 mm | 5 eV | 49 | 23 | 0.47 | ~7 μm |
| 0.2 mm | 1 eV | 49 | 20 | 0.41 | ~7 μm |
| 0.4 mm | 1 eV | 49 | 0 | 0 | |

The ions starting between z=0.2 mm or 0.4 mm result from impact ionization from neutral glass. It is desirable that, downstream of electrode 4 and thus at the output side of the ion source, no ions will appear which have been formed at z>o, i.e. by impact ionization.

Of the ion starting at z=0.2 only 41% appear at the output of the ion source. For the ions starting at z=0.4, there is practically none which appear at the output of the ion source. These ions are trapped in the electrode stretch formed by the electrode 1, 2, 3 and 4.

The electrode arrangement illustrated in FIGS. 4, 5 and 6, because of the different hole diameters, problems of centering and complex configuration of the surfaces, can only be fabricated with some difficulty and at high cost.

It has been found to be advantageous, therefore, to provide electrodes which are defined by planar surfaces since these can be fabricated more easily and less expensively and can be centered more simply. An embodiment of this type has been schematically illustrated in FIG. 7. It is, however, equivalent to that of FIGS. 3 to 6 in functioning and in result. The electrodes 1', 2', 3' and 4' of this embodiment are constituted as plane parallel plates. The windows 8' in the electrodes 2, 3, 4 have the same ration.

The anode (electrode 1) and electrode 3 lie at $+U_o$ while the electrodes 2 and 4 lie at 0 volts.

Figure 7:
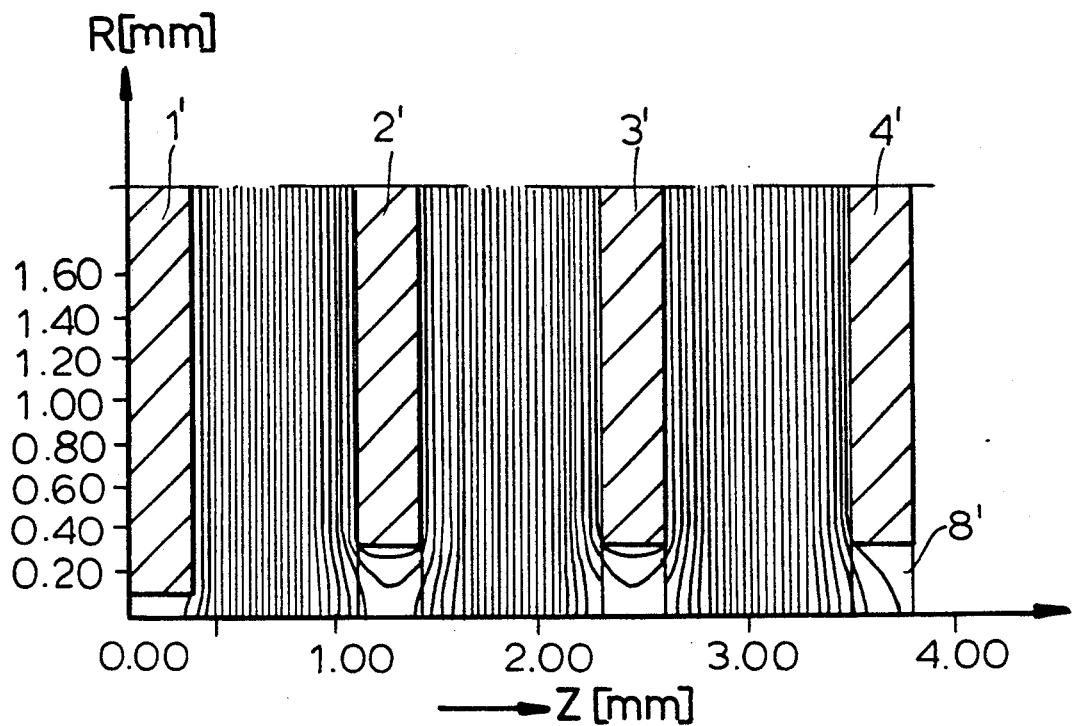
FIG. 7 is a diagram of an electrode arrangement which is simplified by comparison with the embodiments of FIGS. 3-5 and in which the potential lines between the electrodes, which are also rotationally symmetrical, have been shown.

In FIG. 7, the potential lines have been plotted.

Table 2 provides, analogous to Table 1, yet further electrode arrangement of FIG. 7, the size of the virtual sources and the energy selection.

TABLE 2

| $U_o$ | Starting-Z | Starting Energy | Number of Starting Ions | Number of Transmitted Ions | $n/n_o$ | Diameter of the virtual source |
|---|---|---|---|---|---|---|
| 5 kV | 0 mm | 1 eV | 49 | 23 | 0.47 | ~10μm |
| 5 kV | 0 mm | 1 eV | 49 | 14 | 0.29 | |
| 5 kV | 0 mm | 10 eV | 49 | 14 | 0.29 | |
| 3 kV | 0 mm | 1 eV | 49 | 20 | 0.41 | ~10μm |
| 3 kV | 0 mm | 5 eV | 49 | 14 | 0.29 | |
| 3 kV | 0 mm | 10 eV | 49 | 9 | 0.19 | |
| 3 kV | 0.2 mm | 0.1 eV | 49 | 27 | 0.55 | |

From the values of $n/n_o$ with a starting energy of z=0 mm, one can see that in this embodiment the total current is reduced to less than half of the ions emerging from the plasma. This poses no problem as long as the plasma can generate sufficient ions. It is also apparent from this table that there is an energy selection within the "intrinsic" energy unsharpness (starting energy 1 to 10 eV with a starting z=0), as well as a selection for the ions formed downstream of the anode. The energy of the ions starting at z=0.2 mm amounts to about $0.97 \times U_o$ KeV (in terms of the setpoint energy of $U_o$ KeV).

Figure 8:
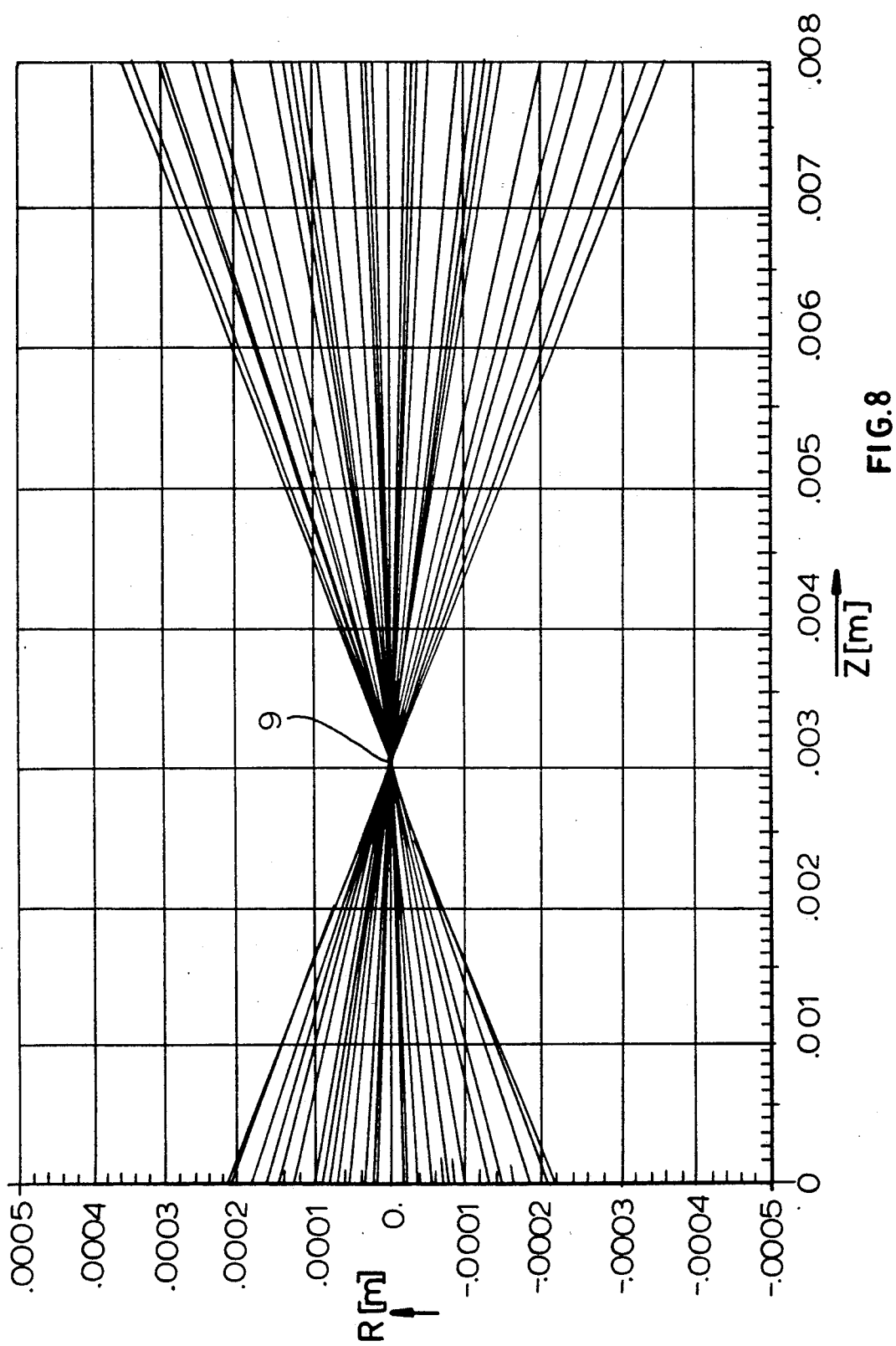
FIG. 8 illustrates the rearward extension of the ion tracks for an arrangement as in FIG. 7 with a starting energy of the ions of one eV and an anode voltage $U_o$ of 3 kV.

FIG. 8 shows the positions and size of the virtual force 9, analogous to FIG. 6, but for the electrode 6 according to FIG. 7. The potential $U_o$ on the electrodes 1 and 3 is 3 kV, the potential of the electrodes 2 and 4 is 0 V. The starting energy of the ions amounts to 1 eV.

Figure 9:
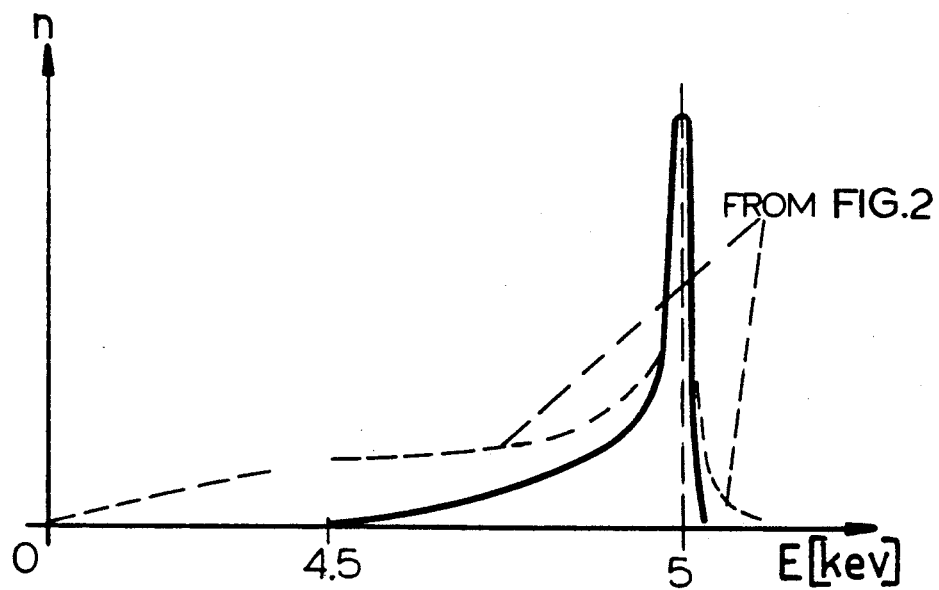
FIG. 9 is a schematic illustration of the energy distribution of the ions downstream of the fourth electrode of an arrangement according to FIG. 7 also plotting the ion fraction along the ordinate against energy along the abscissa.

FIG. 9 illustrates the energy distribution of the embodiment of FIG. 7 with its improved energy selection for the ions entering the lens system of an ion projection lithography apparatus, utilizing the ion force of this invention.

A typical voltage supply network 50 can apply the respective potentials to the electrodes as has been described and the ion imaging system is represented at 51 in FIG. 3 downstream from the ion source.

I claim:

1. A duoplasmatron type ion source for use with an ion-optic imaging system, comprising:
   a plasma chamber having an outlet from which ions generated in said plasma chamber emerge; and
   an electrode assembly aligned with said outlet and traversed by ions supplied to said ion-optic imaging system, said electrode assembly comprising:
   first, second, third and fourth axially spaced electrodes arrayed in succession along a path of said ions through said assembly, having axially aligned windows traversed by said ions and centered on a common axis,
   means for applying approximately the same potentials to said second and fourth electrodes, and
   means for applying to said first and third electrodes substantially the same potentials at a level higher than the potentials at said second and fourth electrodes so that the ions traversing said assembly are accelerated to a final energy by a potential difference between said first and fourth electrodes, at said potentials of said electrodes, the spacing between two neighboring electrodes being is selected to produce an electrical field strength therebetween in a region of said axis which exceeds 5 megavolt/meter.

2. The duoplasmatron type ion source defined in claim 1 wherein the potential of said third electrode is so dimensioned that at the center of the window of the third electrode, its potential is equal to or only slightly less than the potential of said first electrode.

3. The duoplasmatron type ion source defined in claim 1 wherein said window of said third electrode has a cross section which is at least as great as the cross section of the window of the fourth electrode, the smallest cross section of the windows of said electrodes being that of said first electrode, said first electrode defining said outlet.

4. The duoplasmatron type ion source defined in claim 1 wherein said third electrode has the largest cross section of the windows of said electrodes.

5. The duoplasmatron type ion source defined in claim 1 wherein said electrodes are plane-parallel plates.

6. The duoplasmatron type ion source defined in claim 5 wherein said second, third and fourth electrodes have windows of the same cross sectional areas.

7. The duoplasmatron type ion source defined in claim 1 wherein said first and third electrodes are at exactly the same potentials and said second and fourth electrodes are at exactly the same potentials.

8. The duoplasmatron type ion source defined in claim 7 wherein said first electrode is at ground potential and the fourth electrode is at a negative potential.

9. A duoplasmatron type ion source for use with an ion-optic imaging system, comprising:
   a plasma chamber having an outlet from which ions generated in said plasma chamber emerge; and
   an electrode assembly aligned with said outlet and traversed by ions supplied to said ion-optic imaging system, said electrode assembly comprising:
      first, second, third and fourth axially spaced electrodes arrayed in succession along a path of said ions through said assembly, having axially aligned windows traversed by said ions and centered on a common axis,
      means for applying approximately the same potentials to said second and fourth electrodes, and
      means for applying to said first and third electrodes substantially the same potentials at a level higher than the potentials at said second and fourth electrodes so that the ions traversing said assembly are accelerated to a final energy by a potential difference between said first and fourth electrodes, said first and third electrodes being at exactly the same potentials and said second and fourth electrodes being at exactly the same potentials, said first electrode being at a positive potential and the fourth electrode being at ground potential.

10. The duoplasmatron type ion source defined in claim 9 wherein at said potentials of said electrodes, the spacing between two neighboring electrodes is selected to produce an electrical field strength therebetween in a region of said axis which exceeds 5 megavolt/meter.

11. The duoplasmatron type ion source defined in claim 9 wherein the potential of said third electrode is so dimensioned that at the center of the window of the third electrode, its potential is equal to or only slightly less than the potential of said first electrode.

12. The duplasmatron type ion source defined in claim 9 wherein said window of said third electrode has a cross section which is at least as great as the cross section of the window of the fourth electrode, the smallest cross section of the windows of said electrodes being that of said first electrode, said first electrode defining said outlet.

13. The duoplasmatron type ion source defined in claim 12 wherein said third electrode has the largest cross section of the windows of said electrodes.

14. The duoplasmatron type ion source defined in claim 13 wherein said electrodes are plane-parallel plates.

15. The duoplasmatron type ion source defined in claim 14 wherein said second, third and fourth electrodes have windows of the same cross sectional areas.

16. The duoplasmatron type ion source defined in claim 13 wherein said electrodes are generally frusto-conical.

* * * * *